(12) United States Patent
Miyake

(10) Patent No.: US 7,382,006 B2
(45) Date of Patent: Jun. 3, 2008

(54) PHOTO-CONDUCTIVE LAYER FOR CONSTITUTING A RADIATION IMAGING PANEL

(75) Inventor: Kiyoteru Miyake, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 412 days.

(21) Appl. No.: 11/091,384

(22) Filed: Mar. 29, 2005

(65) Prior Publication Data

US 2005/0214582 A1  Sep. 29, 2005

(30) Foreign Application Priority Data

Mar. 29, 2004   (JP)   ............... 2004-095019

(51) Int. Cl.
  *H01L 31/115*   (2006.01)
  *G03G 15/054*   (2006.01)
  *G03G 13/054*   (2006.01)

(52) U.S. Cl. .................. 257/291; 257/428; 378/28; 378/29; 430/84

(58) Field of Classification Search ............... 257/291, 257/428; 378/28, 29; 430/84
See application file for complete search history.

(56) References Cited

U.S. PATENT DOCUMENTS

| 4,368,386 A | * | 1/1983 | Huignard et al. ..... 250/214 LA |
| 4,577,108 A | * | 3/1986 | Diepers et al. ........ 250/370.09 |
| 4,953,189 A | * | 8/1990 | Wang ..................... 378/108 |
| 6,268,614 B1 | | 7/2001 | Imai | |
| 6,717,173 B2 | | 4/2004 | Isoda | |

FOREIGN PATENT DOCUMENTS

JP   11-211832 A   8/1998

OTHER PUBLICATIONS

Download from Substance Registry System of the US Environmental Protection Agency, entry "Bismuth germanium oxide" at http://iaspub.epa.gov/srs/srs_proc_qry.navigate?P_SUB_ID=181115, 3 pages.*
"Phosphor Handbook", Edited by Shigeo Shionoya and William M. Yen, CRC Press, 1998, pp. 540-545.
E. C. Subbarao, Physical Review, vol. 122, No. 3, pp. 804-807, 1961.
L. Pintilie, et al., "Ferroelectrics: new wide-gap materials for UV detection", Materials Science and Engineering B80, 2001, pp. 388-391.

* cited by examiner

*Primary Examiner*—Evan Pert
(74) *Attorney, Agent, or Firm*—Sughrue Mion, PLLC

(57) ABSTRACT

A photo-conductive layer for constituting a radiation imaging panel, which photo-conductive layer is capable of recording radiation image information as an electrostatic latent image, contains $Bi_4M_3O_{12}$, in which M represents at least one kind of element selected from the group consisting of Ge, Si, and Ti. The photo-conductive layer may be formed with a coating technique or as a sintered film. The photo-conductive layer has a large effect of collecting formed electric charges and enhanced sensitivity, and is capable of yielding an image with good graininess characteristics.

3 Claims, 5 Drawing Sheets

PHOTO-CONDUCTIVE LAYER FOR CONSTITUTING A RADIATION IMAGING PANEL

BACKGROUND OF THE INVENTION

1. Field of the Invention

This invention relates to a photo-conductive layer for constituting a radiation imaging panel, which is appropriate for used in a radiation imaging apparatus, such as an X-ray imaging apparatus. This invention also relates to a radiation imaging panel comprising the photo-conductive layer.

2. Description of the Related Art

There have heretofore been proposed X-ray imaging panels designed for use in a medical X-ray image recording operation, such that a radiation dose delivered to an object during the medical X-ray image recording operation may be kept small, and such that the image quality of an image and its capability of serving as an effective tool in, particularly, the efficient and accurate diagnosis of an illness may be enhanced. With the proposed X-ray imaging panels, a photo-conductive layer sensitive to X-rays is employed as a photosensitive material. The photo-conductive layer is exposed to X-rays carrying X-ray image information, and an electrostatic latent image is thereby formed on the photo-conductive layer. Thereafter, the electrostatic latent image, which has been formed on the photo-conductive layer, is read out by use of light or a plurality of electrodes. The techniques utilizing the X-ray imaging panels have advantages over the known photo-fluorography utilizing TV image pickup tubes in that an image is capable of being obtained with a high resolution.

Specifically, when X-rays are irradiated to a charge forming layer located in the X-ray imaging panel, electric charges corresponding to X-ray energy are formed in the charge forming layer. The thus formed electric charges are read out as an electric signal. The photo-conductive layer described above acts as the charge forming layer. As the material for the photo-conductive layer, amorphous selenium (a-Se), $PbI_2$, $HgI_2$, Cd(Zn)Te, or the like, has heretofore been used. (The materials for the photo-conductive layer are described in, for example, U.S. Pat. No. 6,268,614 and Japanese Unexamined Patent Publication No. 11(1999)-211832.)

However, of the radio-conductive materials described in U.S. Pat. No. 6,268,614 and Japanese Unexamined Patent Publication No. 11(1999)-211832, amorphous selenium has the problems in that it is necessary for the layer thickness to be set large because of a low radiation absorption efficiency, application of a high electric field is required, and therefore the reliability is not capable of being kept high. Also, each of PbI2, HgI2, Cd(Zn)Te has the problems in that a dark current is high, and the signal-to-noise ratio is not capable of being kept high.

Therefore, the use of $BiI_3$ as the radio-conductive material has been proposed in, for example, U.S. Pat. No. 2,717,173. $BiI_3$ has the advantages in that the load to the environment is low. However, $BiI_3$ has the problems in that, in cases where a layer of $BiI_3$ is formed with a coating technique, the effect of collecting the formed electric charges is small, electric noise becomes high, and therefore the image graininess characteristics become bad. Also, as the material for the radio-conductive material, ZnO is described in, for example, Japanese Unexamined Patent Publication No. 11(1999)-211832. ZnO has the advantages in that the load to the environment is low. However, ZnO has the problems in that, since the radiation absorption efficiency is low, a high sensitivity is not capable of being obtained.

As materials for scintillators, $Bi_4Si_3O_{12}$ and $Bi_4Ge_3O_{12}$ have been known. (The use of $Bi_4Si_3O_{12}$ and $Bi_4Ge_3O_{12}$ as the materials for scintillators is described in, for example, "Phosphor Handbook" edited by Shigeo Shionoya and William M. Yen, CRC Press, 1998 pp. 540-545.) Also, as a ferroelectric material, $Bi_4Ti_3O_{12}$ has been known. ($Bi_4Ti_3O_{12}$ is described in, for example, "Physical Review," Vol. 122, No. 3, pp. 804-807, 1961.)

However, whether $Bi_4M_3O_{12}$, such as $Bi_4Si_3O_{12}$, $Bi_4Ge_3O_{12}$, or $Bi_4Ti_3O_{12}$ described in "Phosphor Handbook" edited by Shigeo Shionoya and William M. Yen, CRC Press, 1998 pp. 540-545, or "Physical Review," Vol. 122, No. 3, pp. 804-807, 1961, exhibits or does not exhibit the photo-conductivity has not heretofore been known at all. Also, $Bi_4M_3O_{12}$ described above has not yet been selected as the photo-conductive material. The applicant conducted extensive research and found that $Bi_4M_3O_{12}$ has the photo-conductivity. The present invention is based upon the findings described above.

SUMMARY OF THE INVENTION

The primary object of the present invention is to provide a photo-conductive layer, which contains a novel photo-conductive material.

Another object of the present invention is to provide a radiation imaging panel comprising the photo-conductive layer.

The present invention provides a photo-conductive layer for constituting a radiation imaging panel, which photo-conductive layer is capable of recording radiation image information as an electrostatic latent image, wherein the photo-conductive layer contains $Bi_4M_3O_{12}$, in which M represents at least one kind of element selected from the group consisting of Ge, Si, and Ti.

The photo-conductive layer in accordance with the present invention may be modified such that the photo-conductive layer is formed with a coating technique (and contains a binder).

Alternatively, the photo-conductive layer in accordance with the present invention may be modified such that the photo-conductive layer is a sintered film (which is free from binders).

The present invention also provides a radiation imaging panel, comprising a photo-conductive layer, which is capable of recording radiation image information as an electrostatic latent image, wherein the photo-conductive layer contains $Bi_4M_3O_{12}$, in which M represents at least one kind of element selected from the group consisting of Ge, Si, and Ti.

The photo-conductive layer in accordance with the present invention is the photo-conductive layer for constituting the radiation imaging panel, which photo-conductive layer is capable of recording the radiation image information as the electrostatic latent image, wherein the photo-conductive layer contains $Bi_4M_3O_{12}$, in which M represents at least one kind of element selected from the group consisting of Ge, Si, and Ti. Therefore, with the photo-conductive layer in accordance with the present invention, a large effect of collecting the formed electric charges is capable of being obtained, and the sensitivity is capable of being enhanced. Also, with the photo-conductive layer in accordance with the present invention, since electric noise is capable of being kept low, an image with good graininess characteristics is capable of being obtained. Further, the photo-conductive layer containing Bi4M3O12 has the advantages in that the photo-conductive layer has good durability and is free from any toxicity, and in that the load to the environment is capable of being kept small.

Particularly, $BiI_3$, or the like, which has heretofore been known as the photo-conductive material, has the problems in that, in cases where the photo-conductive layer constituted of $BiI_3$, or the like, is formed with the coating technique, the effect of collecting the formed electric charges is small due to, for example, carbonization of impurities contained in the binder, and the graininess characteristics of the obtained image are bad. However, with the photo-conductive layer in accordance with the present invention, which contains $Bi_4M_3O_{12}$, in cases where the photo-conductive layer is formed with the coating technique, a high sensitivity is capable of being obtained. Further, since the photo-conductive layer formed with the coating technique is capable of being produced at a low cost, the production cost of the radiation imaging panel is capable of being kept low.

In cases where the photo-conductive layer in accordance with the present invention, which contains $Bi_4M_3O_{12}$, is formed as the sintered film, the $Bi_4M_3O_{12}$ packing density is capable of being kept high. Therefore, the photo-conductive layer becomes a dense layer, and the X-ray absorptivity is capable of being enhanced. Also, a large effect of collecting the formed electric charges is capable of being obtained, and the sensitivity is capable of being enhanced marked.

DESCRIPTION OF THE PREFERRED EMBODIMENTS

Figure 1:
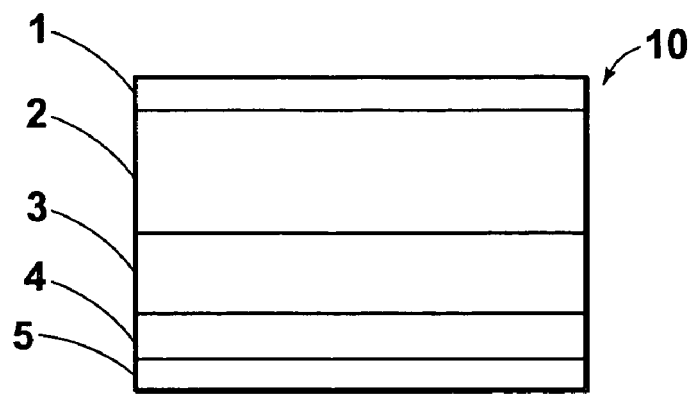
FIG. 1 is a sectional view showing an embodiment of the radiation imaging panel in accordance with the present invention, which comprises a photo-conductive layer in accordance with the present invention.

The present invention will hereinbelow be described in further detail with reference to the accompanying drawings.

The photo-conductive layer in accordance with the present invention, which contains $Bi_4M_3O_{12}$, may be formed with the coating technique. Specifically, for example, $Bi_2O_3$ and $MO_2$ in a stoichiometric ratio are mixed together and fired. (M as used herein represents at least one kind of element selected from the group consisting of Ge, Si, and Ti.) In this manner, $Bi_4M_3O_{12}$ particles are formed. The $Bi_4M_3O_{12}$ particles are then mixed with a binder, and the thus obtained coating composition is applied onto a substrate. The coating composition having been applied onto the substrate is then dried, and the photo-conductive layer, which contains $Bi_4M_3O_{12}$, is thereby formed.

Alternatively, the photo-conductive layer in accordance with the present invention, which contains $Bi_4M_3O_{12}$, may be formed in the manner described below. Specifically, a nitrate of Bi, an acetate of Bi, or an alkoxide of Bi, which acts as a Bi source, may be subjected to reaction with a sodium salt of silicic acid, an alkoxide of Si (e.g., tetraethoxysilane), an ammonium salt of titanic acid, or an alkoxide of Ti (e.g., titanium tetraisopropoxide), which acts as an Si source or a Ti source. Also, the thus obtained reaction product is subjected to a sintering process, and $Bi_4Si_3O_{12}$ particles or $Bi_4Ti_3O_{12}$ particles are thereby obtained. The thus obtained $Bi_4M_3O_{12}$ particles are then mixed with a binder, and the thus obtained coating composition is applied onto a substrate. The coating composition having been applied onto the substrate is then dried, and the photo-conductive layer, which contains $Bi_4M_3O_{12}$, is thereby formed.

As the binder, various known binders may be used. Examples of the preferable binders include nitrocellulose, ethylcellulose, cellulose acetate, a vinylidene chloride-vinyl chloride copolymer, a polyalkyl methacrylate, a polyurethane, a polyvinyl butyral, a polyester, a polystyrene, a polyamide, a polyethylene, a polyvinyl chloride, a polyvinyl acetate, a vinyl chloride-vinyl acetate copolymer, a polyvinyl alcohol, a linear polyester, a nylon, and carboxymethyl cellulose.

Also, the photo-conductive layer in accordance with the present invention, which contains $Bi_4M_3O_{12}$, may be formed as the sintered film.

Specifically, for example, $Bi_2O_3$ and $MO_2$ in the stoichiometric ratio are mixed together and fired. In this manner, $Bi_4M_3O_{12}$ particles are formed. (Alternatively, a nitrate of Bi, an acetate of Bi, or an alkoxide of Bi, which acts as the Bi source, may be subjected to reaction with a sodium salt of silicic acid, an alkoxide of Si (e.g., tetraethoxysilane), an ammonium salt of titanic acid, or an alkoxide of Ti (e.g., titanium tetraisopropoxide), which acts as the Si source or the Ti source. Also, the thus obtained reaction product is subjected to the sintering process, and $Bi_4Si_3O_{12}$ particles or $Bi_4Ti_3O_{12}$ particles are thereby obtained.) Thereafter, the thus obtained $Bi_4M_3O_{12}$ particles are subjected to one of known processing techniques, such as an aerosol deposition technique (AD technique), a press sintering technique, and a green sheet technique. With the aerosol deposition technique, the $Bi_4M_3O_{12}$ particles are caused to fly by a carrier gas in a vacuum, and the carrier gas containing the $Bi_4M_3O_{12}$ particles is blown against a substrate in a vacuum. In this manner, the $Bi_4M_3O_{12}$ particles are deposited on the substrate. With the press sintering technique, the $Bi_4M_3O_{12}$ particles are pressed at a high pressure by use of a pressing machine, and a film of the $Bi_4M_3O_{12}$ particles is thus formed. Also, the thus formed film is subjected to a sintering process. With the green sheet technique, the $Bi_4M_3O_{12}$ particles are mixed with a binder, and the thus obtained coating composition is applied onto a substrate. In this manner, a green sheet (i.e., the film containing the binder) is formed. Thereafter, the thus formed green sheet is subjected to a sintering process. In this manner, the binder is removed from the film, and the $Bi_4M_3O_{12}$ particles are sintered.

With the green sheet technique, the binder is used. Examples of preferable binders for use in the green sheet technique include cellulose acetate, a polyalkyl methacrylate, a polyvinyl alcohol, and a polyvinyl butyral.

Ordinarily, radiation imaging panels may be classified into a direct conversion type, in which the radiation energy is directly converted into electric charges, and the thus formed electric charges are accumulated, and an indirect conversion type, in which the radiation energy is converted into light by use of a scintillator, such as CsI, the thus obtained light is then converted into electric charges by use of a-Si photodiodes, and the thus formed electric charges are accumulated. The photo-conductive layer in accordance with the present invention is employed for the direct conversion type of the radiation imaging panel. The photo-conductive layer in accordance with the present invention may be employed for the radiation, such as X-rays, γ-rays, and α-rays.

The photo-conductive layer in accordance with the present invention may be employed for an optical read-out technique, in which the read-out operation is performed by use of a radiation image detector utilizing a semiconductor material capable of generating the electric charges when being exposed to light. The photo-conductive layer in accordance with the present invention may also be employed for a TFT technique. With the TFT technique, the electric charges having been generated with the irradiation of the radiation are accumulated, and the accumulated electric charges are read through an operation, in which an electric switch, such as a thin film transistor (TFT), is turned on and off with respect each of pixels.

Firstly, by way of example, the radiation imaging panel employed for the optical read-out technique will be described hereinbelow.

FIG. 1 is a sectional view showing an embodiment of the radiation imaging panel in accordance with the present invention, which comprises a photo-conductive layer in accordance with the present invention.

With reference to FIG. 1, a radiation imaging panel 10 comprises a first electrically conductive layer 1, which has transmissivity to recording radiation L1 described later. The radiation imaging panel 10 also comprises a recording radio-conductive layer 2, which exhibits electrical conductivity when it is exposed to the radiation L1 having passed through the first electrically conductive layer 1. The radiation imaging panel 10 further comprises a charge transporting layer 3, which acts approximately as an insulator with respect to electric charges (latent image polarity charges, e.g. negative charges) having a polarity identical with the polarity of electric charges occurring in the first electrically conductive layer 1, and which acts approximately as a conductor with respect to electric charges (transported polarity charges, positive charges in this example) having a polarity opposite to the polarity of the electric charges occurring in the first electrically conductive layer 1. The radiation imaging panel 10 still further comprises a reading photo-conductive layer 4, which exhibits electrical conductivity when it is exposed to reading light L2 described later, and a second electrically conductive layer 5 having transmissivity to the reading light L2. The first electrically conductive layer 1, the recording radio-conductive layer 2, the charge transporting layer 3, the reading photo-conductive layer 4, and the second electrically conductive layer 5 are overlaid in this order.

As each of the first electrically conductive layer 1 and the second electrically conductive layer 5, a film of an electrically conductive substance (tin dioxide film, or the like) uniformly coated on a transparent glass plate may be employed.

The charge transporting layer 3 may be constituted of one of various materials, which have the characteristics such that the difference between the mobility of the negative electric charges occurring in the first electrically conductive layer 1 and the mobility of the positive electric charges is large. The charge transporting layer 3 should preferably be constituted of, for example, an organic compound, such as a poly-N-vinylcarbazole (PVK), N,N'-diphenyl-N,N'-bis(3-methylphenyl)-[1,1'-biphenyl]-4,4'-diamine (TPD), or a disk-shaped liquid crystal; or a semiconductor substance, such as a polymer (polycarbonate, polystyrene, PVK) dispersion of TPD, or a-Se doped with 10 ppm to 200 ppm of Cl. In particular, the organic compound (PVK, TPD, or the disk-shaped liquid crystal) has light insensitivity and is therefore preferable. Also, since the permittivity is ordinarily low, the capacity of the charge transporting layer 3 and the capacity of the reading photo-conductive layer 4 become small, and the signal take-out efficiency at the time of readout is capable of being kept high.

The reading photo-conductive layer 4 should preferably be constituted of, for example, a photo-conductive material containing, as a principal constituent, at least one substance selected from the group consisting of a-Se, Se—Te, Se—As—Te, metal-free phthalocyanine, metallo-phthalocyanine, magnesium phthalocyanine (MgPc), phase II of vanadyl phthalocyanine (VoPc), and copper phthalocyanine (CuPc).

As the recording radio-conductive layer 2, the photo-conductive layer in accordance with the present invention, which contains $Bi_4M_3O_{12}$, is employed. Specifically, the photo-conductive layer in accordance with the present invention is the recording radio-conductive layer.

The optical read-out technique for reading out the electrostatic latent image will hereinbelow be described briefly.

Figure 2:
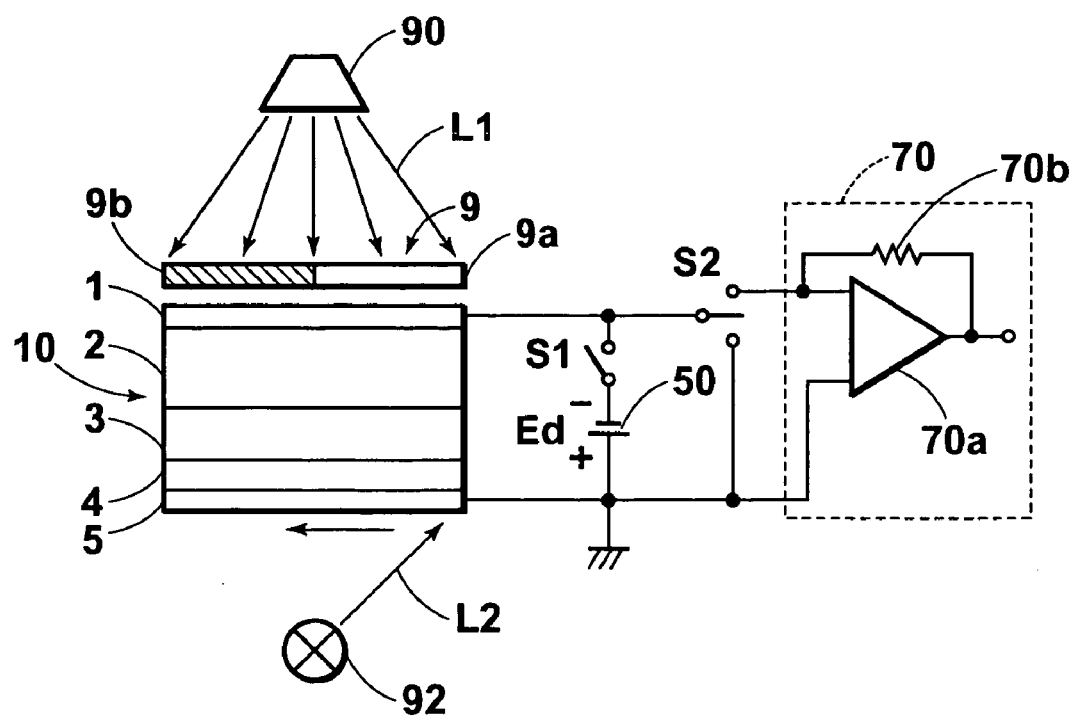
FIG. 2 is a schematic view showing a recording and read-out system, in which the radiation imaging panel of FIG. 1 is employed.

FIG. 2 is a schematic view showing a recording and read-out system (i.e., a combination of an electrostatic latent image recording apparatus and an electrostatic latent image read-out apparatus), in which the radiation imaging panel 10 of FIG. 1 is employed. With reference to FIG. 2, the recording and read-out system comprises the radiation imaging panel 10 and recording irradiation means 90. The recording and read-out system also comprises an electric power source 50 and electric current detecting means 70. The recording and read-out system further comprises read-out exposure means 92, connection means S1, and connection means S2. The electrostatic latent image recording apparatus is constituted of the radiation imaging panel 10, the electric power source 50, the recording irradiation means 90, and the connection means S1. The electrostatic latent image read-out apparatus is constituted of the radiation imaging panel 10, the electric current detecting means 70, and the connection means S2.

The first electrically conductive layer 1 of the radiation imaging panel 10 is connected via the connection means S1 to a negative pole of the electric power source 50. The first electrically conductive layer 1 of the radiation imaging panel 10 is also connected to one end of the connection means S2. One terminal of the other end of the connection means S2 is connected to the electric current detecting means 70. The second electrically conductive layer 5 of the radiation imaging panel 10, a positive pole of the electric power source 50, and the other terminal of the other end of the connection means S2 are grounded. The electric current detecting means 70 comprises a detection amplifier 70a, which is constituted of an operational amplifier, and a feedback resistor 70b. The electric current detecting means 70 thus constitutes a current-to-voltage converting circuit.

An object 9 lies at the top surface of the first electrically conductive layer 1. The object 9 has a transmissive region 9a, which has the transmissivity to the radiation L1, and a light blocking region 9b, which does not have the transmissivity to the radiation L1. The recording irradiation means 90 uniformly irradiates the radiation L1 to the object 9. With the read-out exposure means 92, the reading light L2, such as an infrared laser beam, an LED light, or an EL light, is scanned in the direction indicated by the arrow in FIG. 2. The reading light L2 should preferably has a beam shape having been converged into a small beam diameter.

Figure 3A:
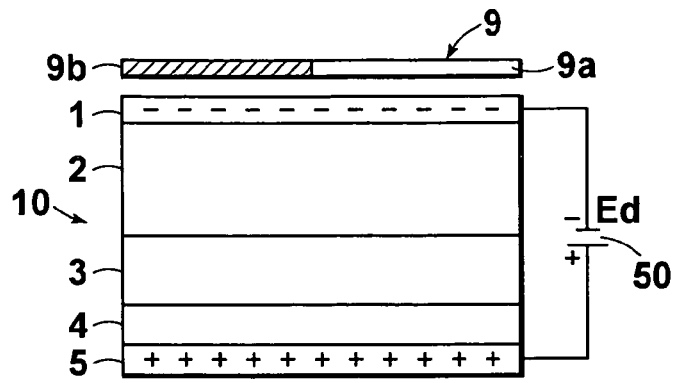
FIGS. 3A to 3D are explanatory views showing electric charge models for explanation of an electrostatic latent image recording stage in the recording and read-out system of FIG. 2, FIGS. 4A to 4D are explanatory views showing electric charge models for explanation of an electrostatic latent image read-out stage in the recording and read-out system of FIG. 2.

An electrostatic latent image recording stage in the recording and read-out system of FIG. 2 will be described hereinbelow with reference to FIGS. 3A to 3D. FIGS. 3A to 3D are explanatory views showing electric charge models for explanation of an electrostatic latent image recording stage in the recording and read-out system of FIG. 2. The connection means S2 illustrated in FIG. 2 is set in an open state (in which the connection means S2 is not connected to the ground nor to the electric current detecting means 70). Also, as illustrated in FIG. 3A, the connection means S1 illustrated in FIG. 2 is set in the on state, and a d.c. voltage Ed supplied by the electric power source 50 is applied between the first electrically conductive layer 1 and the second electrically conductive layer 5. As a result, the negative charges occur in the first electrically conductive layer 1, and the positive charges occur in the second electrically conductive layer 5. In this manner, a parallel electric field is formed between the first electrically conductive layer 1 and the second electrically conductive layer 5.

Figure 3B:
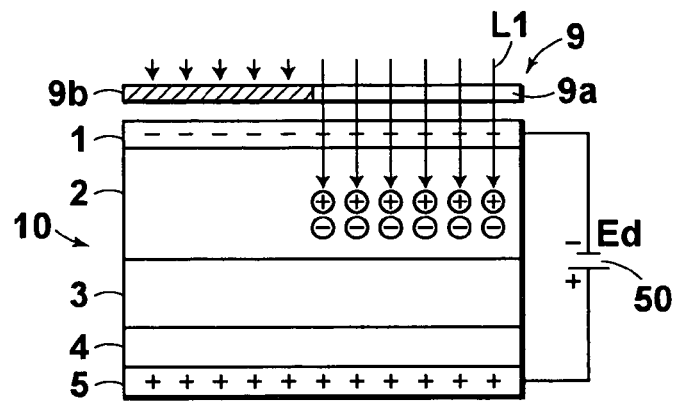

Thereafter, as illustrated in FIG. 3B, the radiation L1 is uniformly irradiated from the recording irradiation means 90 toward the object 9. The radiation L1, which has been produced by the recording irradiation means 90, passes through the transmissive region 9a of the object 9. The radiation L1 then passes through the first electrically conductive layer 1 and impinges upon the recording radio-conductive layer 2. When the recording radio-conductive layer 2 receives the radiation L1 having passed through the first electrically conductive layer 1, the recording radio-conductive layer 2 exhibits the electrical conductivity. The characteristics of the recording radio-conductive layer 2 for exhibiting the electrical conductivity are capable of being found from the characteristics in that the recording radio-conductive layer 2 acts as a variable resistor exhibiting a resistance value variable in accordance with the dose of the radiation L1. The resistance value depends upon the occurrence of electric charge pairs of electrons (negative charges) and holes (positive charges) due to the radiation L1. In cases where the dose of the radiation L1, which has passed through the object 9, is small, a large resistance value is exhibited. In FIG. 3B, the negative charges (−) formed by the radiation L1 are represented by "−" surrounded by the "○" mark, and the positive charges (+) formed by the radiation L1 are represented by "+" surrounded by the "○" mark.

Figure 3C:
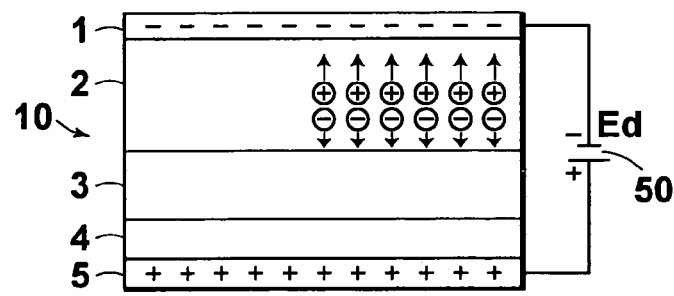
Figure 3D:
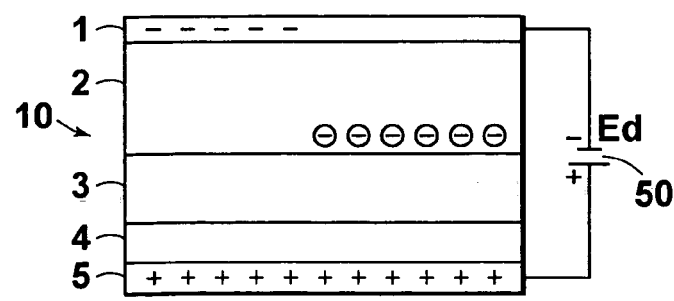

As illustrated in FIG. 3C, the positive charges, which have occurred in the recording radio-conductive layer 2, quickly migrate through the recording radio-conductive layer 2 toward the first electrically conductive layer 1. Also, as illustrated in FIG. 3D, the positive charges, which have migrated through the recording radio-conductive layer 2 toward the first electrically conductive layer 1, undergo charge re-combination with the negative charges, which have been formed in the first electrically conductive layer 1. The charge re-combination occurs at the interface between the first electrically conductive layer 1 and the recording radio-conductive layer 2, and the positive charges described above disappear.

Also, as illustrated in FIG. 3C, the negative charges, which have occurred in the recording radio-conductive layer 2, migrate through the recording radio-conductive layer 2 toward the charge transporting layer 3. The charge transporting layer 3 acts as the insulator with respect to the electric charges (in this example, the negative charges) having the polarity identical with the polarity of the electric charges occurring in the first electrically conductive layer 1. Therefore, as illustrated in FIG. 3D, the negative charges, which have migrated through the recording radio-conductive layer 2 toward the charge transporting layer 3, cease at the interface between the recording radio-conductive layer 2 and the charge transporting layer 3 and are accumulated at the interface between the recording radio-conductive layer 2 and the charge transporting layer 3. The quantity of the electric charges, which are thus accumulated, is defined by the quantity of the negative charges occurring in the recording radio-conductive layer 2, i.e. the dose of the radiation L1 having passed through the object 9.

The radiation L1 does not pass through the light blocking region 9b of the object 9. Therefore, as illustrated in FIGS. 3B, 3C, and 3D, a change does not occur at the region of the radiation imaging panel 10, which region is located under the light blocking region 9b of the object 9. In the manner described above, in cases where the radiation L1 is irradiated to the object 9, electric charges in accordance with the object image are capable of being accumulated at the interface between the recording radio-conductive layer 2 and the charge transporting layer 3. The object image, which is formed with the thus accumulated electric charges, is referred to as the electrostatic latent image.

Figure 4A:
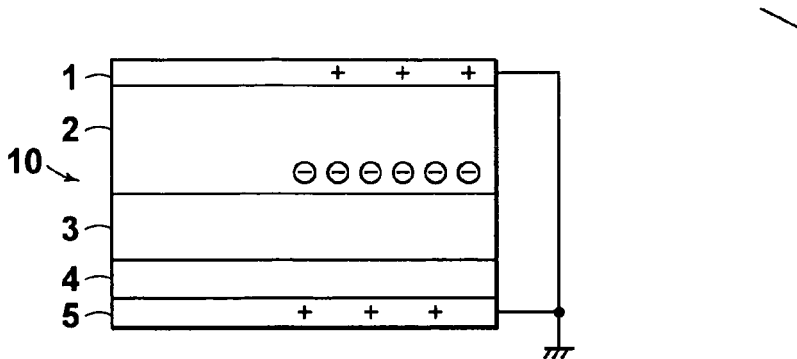

An electrostatic latent image read-out stage in the recording and read-out system of FIG. 2 will be described hereinbelow with reference to FIGS. 4A to 4D. FIGS. 4A to 4D are explanatory views showing electric charge models for explanation of an electrostatic latent image read-out stage in the recording and read-out system of FIG. 2. The connection means S1 illustrated in FIG. 2 is set in the open state, and the supply of the electric power is ceased. Also, as illustrated in FIG. 4A, the connection means S2 illustrated in FIG. 2 is connected to the ground side. In this manner, the first electrically conductive layer 1 and the second electrically conductive layer 5 of the radiation imaging panel 10, on which the electrostatic latent image has been recorded, are set at the identical electric potential, and re-arrangement of the electric charges is performed. Thereafter, the connection means S2 is connected to the side of the electric current detecting means 70.

Figure 4B:
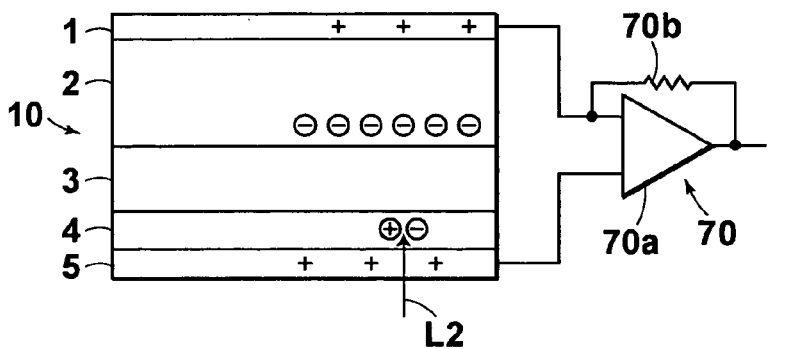

Also, as illustrated in FIG. 4B, with the read-out exposure means 92, the scanning with the reading light L2 is performed from the side fo the second electrically conductive layer 5 of the radiation imaging panel 10. The reading light L2 impinging upon the second electrically conductive layer 5 passes through the second electrically conductive layer 5 and impinges upon the reading photo-conductive layer 4. When the reading photo-conductive layer 4 is exposed to the reading light L2, which has passed through the second electrically conductive layer 5, the reading photo-conductive layer 4 exhibits the electrical conductivity in accordance with the scanning exposure. As in the cases of the characteristics of the recording radio-conductive layer 2 for exhibiting the electrical conductivity due to the occurrence of the pairs of the positive and negative charges when the recording radio-conductive layer 2 is exposed to the radiation L1, the characteristics of the reading photo-conductive layer 4 for exhibiting the electrical conductivity depend upon the occurrence of the pairs of the positive and negative charges when the reading photo-conductive layer 4 is exposed to the reading light L2. As in the cases of the electrostatic latent image recording stage, are capable of being found from the characteristics in that the recording radio-conductive layer 2 acts as a variable resistor exhibiting a resistance value variable in accordance with the dose of the radiation L1. The resistance value depends upon the occurrence of electric charge pairs of electrons (negative charges) and holes (positive charges) due to the radiation L1. In FIG. 4B, the negative charges (−) formed by the reading light L2 are represented by "−" surrounded by the "○" mark, and the positive charges (+) formed by the reading light L2 are represented by "+" surrounded by the "○" mark.

Figure 4C:
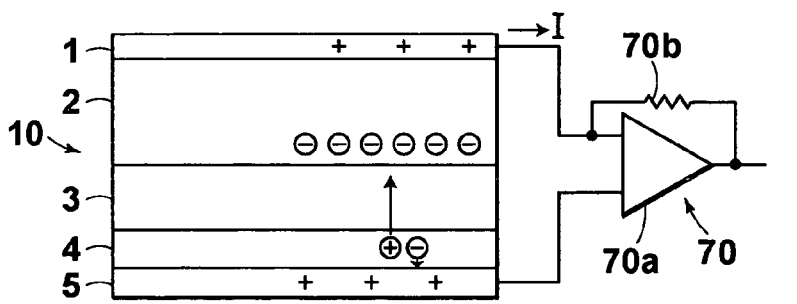
Figure 4D:
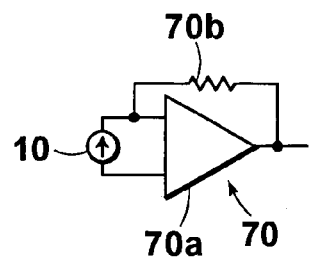

The charge transporting layer 3 acts as the electrical conductor with respect to the positive charges. Therefore, as illustrated in FIG. 4C, the positive charges, which have occurred in the reading photo-conductive layer 4, quickly migrate through the charge transporting layer 3 by being attracted by the negative charges, which have been accumulated at the interface between the recording radio-conductive layer 2 and the charge transporting layer 3. The positive charges, which have thus migrated through the charge transporting layer 3, undergo the charge re-combination with the accumulated negative charges at the interface between the recording radio-conductive layer 2 and the charge transporting layer 3 and disappear. Also, as illustrated in FIG. 4C, the negative charges, which have occurred in the reading photo-conductive layer 4, undergo the charge re-combination with the positive charges of the second electrically conductive layer 5 and disappear. The reading photo-conductive layer 4 is scanned with the reading light L2 having a sufficient optical intensity, and all of the accumulated electric charges, which have been accumulated at the interface between the recording radio-conductive layer 2 and the charge transporting layer 3, i.e. the electrostatic latent image, disappear through the charge re-combination. The disappearance of the electric charges, which have been accumulated in the radiation imaging panel 10, means the state, in which an electric current I flows across the radiation imaging panel 10 due to the migration of the electric charges. The state, in which the electric current I flows across the radiation imaging panel 10 due to the migration of the electric charges, is capable of being represented by an equivalent circuit illustrated in FIG. 4D, in which the radiation imaging panel 10 is represented by the electric current source having the electric current quantity depending upon the quantity of the accumulated electric charges.

As described above, the scanning of the radiation imaging panel 10 with the reading light L2 is performed, and the electric current flowing across the radiation imaging panel 10 is detected. In this manner, the quantity of the accumulated electric charges, which have been accumulated at each of scanned regions (corresponding to pixels), is capable of being detected. The electrostatic latent image is thus capable of being read out. The operations of the radiation detecting section are described in, for example, Japanese Unexamined Patent Publication No. 2000-105297.

Figure 5:
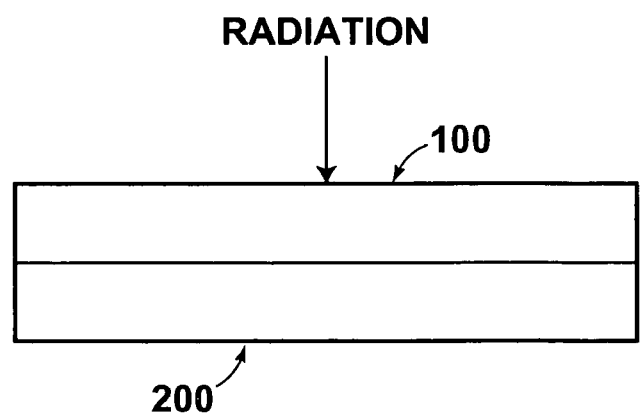
FIG. 5 is an explanatory view showing a radiation detector and an AMA board, which are combined together.
Figure 6:
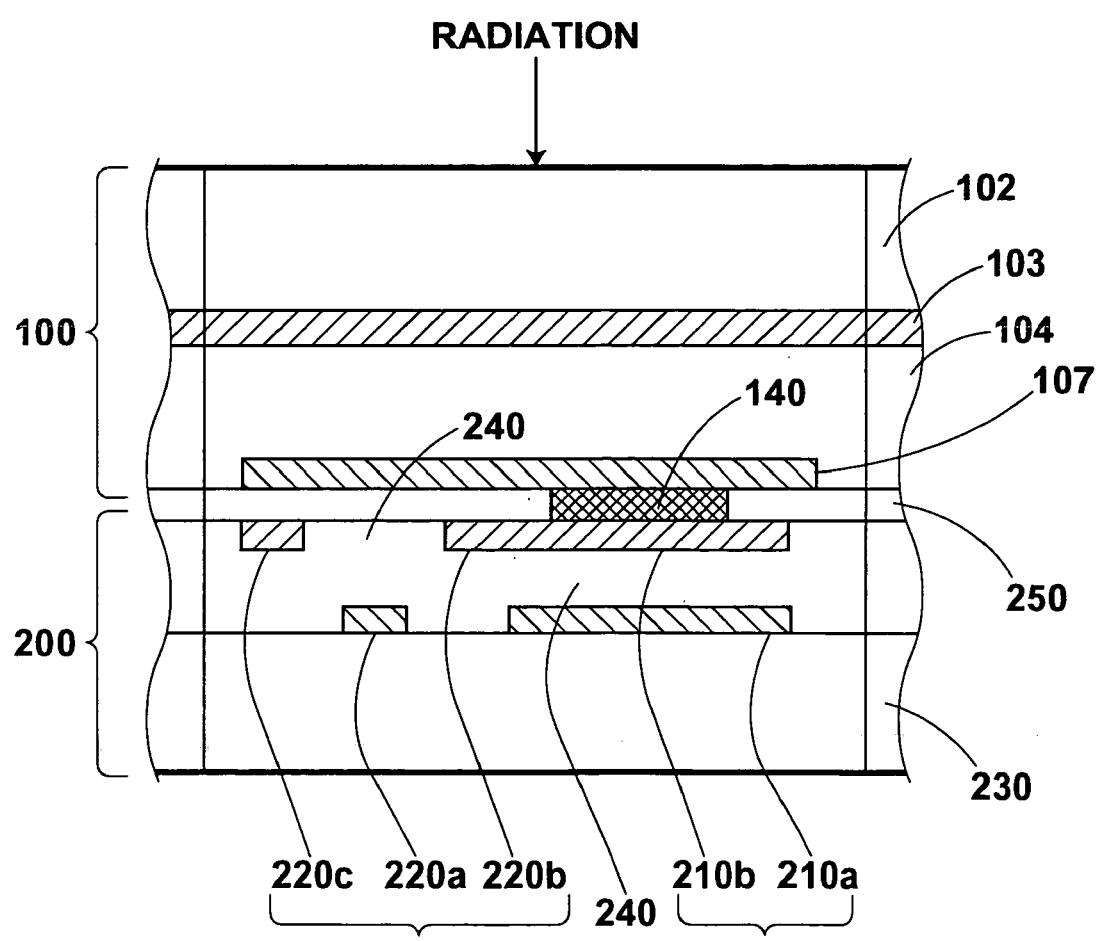
FIG. 6 is an electric circuit diagram showing an equivalent circuit of the AMA board.

The TFT type of the radiation imaging panel will be described hereinbelow. As illustrated in FIG. 5, the TFT type of the radiation imaging panel has a structure, in which a radiation detecting section 100 and an active matrix array board (AMA board) 200 has been joined together. As illustrated in FIG. 6, the radiation detecting section 100 comprises a common electrode 103 for application of a bias voltage. The radiation detecting section 100 also comprises a photo-conductive layer 104, which is sensitive to the radiation to be detected and forms carriers constituted of electron-hole pairs. The radiation detecting section 100 further comprises a detection electrode 107 for collecting the carriers. The common electrode 103, the photo-conductive layer 104, and the detection electrode 107 are overlaid in this order from the radiation incidence side. A radiation detecting section support 102 may be located as a top layer on the common electrode 103.

The photo-conductive layer 104 is the photo-conductive layer in accordance with the present invention, which contains $Bi_4M_3O_{12}$. Each of the common electrode 103 and the detection electrode 107 may be constituted of an electrically conductive material, such as indium tin oxide (ITO), Au, or Pt. In accordance with the polarity of the bias voltage, a hole injection blocking layer or an electron injection blocking layer may be appended to the common electrode 103 or the detection electrode 107.

Figure 7:
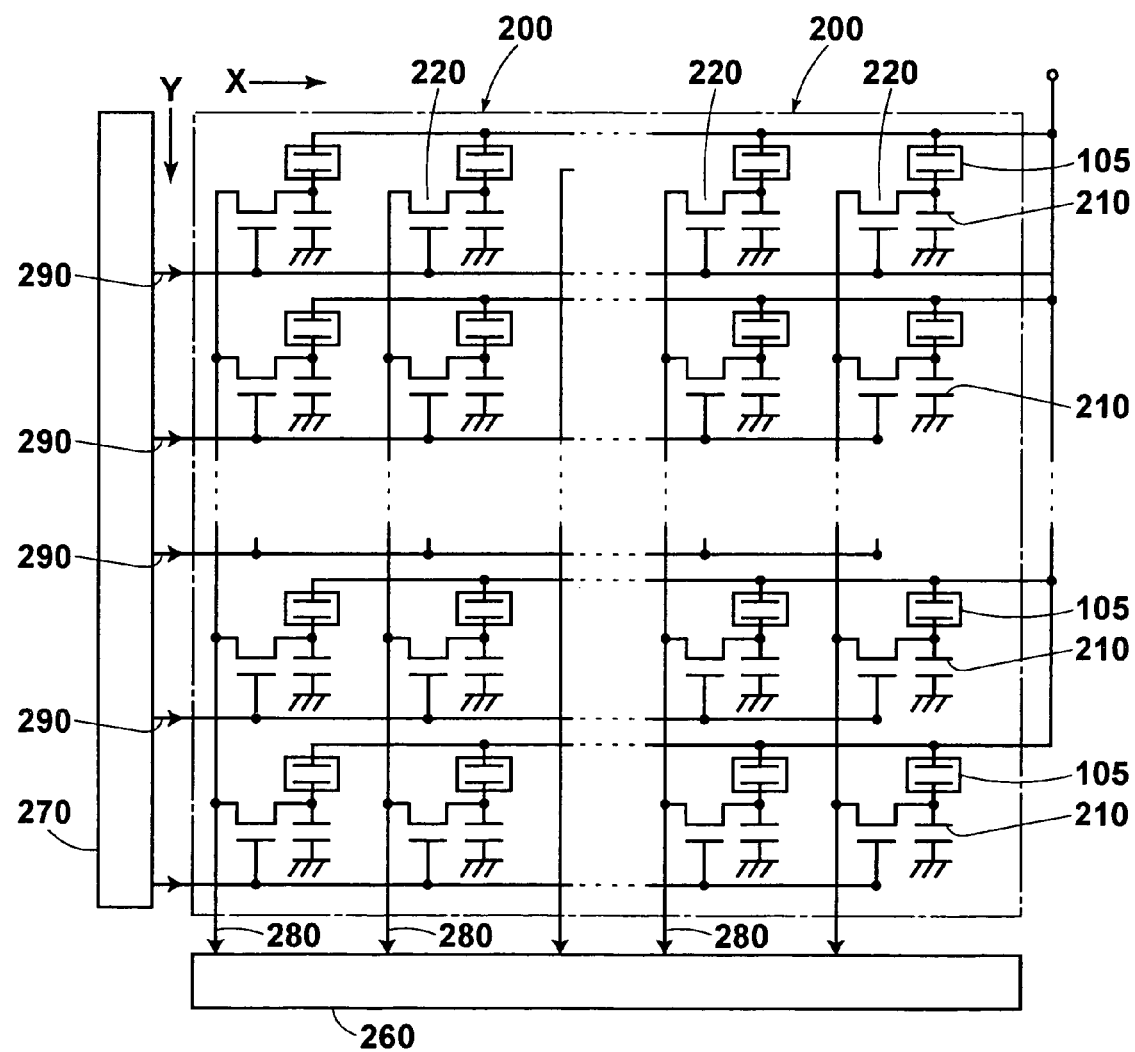
FIG. 7 is a sectional view showing a constitution at each of radiation detecting sections, each of which corresponds to one pixel.

The constitution of the AMA board 200 will hereinbelow be described briefly. As illustrated in FIG. 7, the AMA board 200 comprises capacitors 210, 210, . . . acting as charge accumulating capacitors and TFT's 220, 220, . . . acting as switching devices. One capacitor 210 and one TFT 220 are located for each of radiation detecting sections 105, 105, . . . , which correspond respectively to the pixels. On the radiation detecting section support 102, in accordance with the necessary pixels, the radiation detecting sections 105, 105, . . . corresponding to the pixels are arrayed in two-dimensional directions in a pattern of a matrix comprising approximately 1,000~3,000 rows×1,000~3,000 columns. Also, the AMA board 200 comprises the same number of the combinations of the capacitor 210 and the TFT 220 as the number of the pixels are arrayed in two-dimensional directions in the same matrix patter as that described above. The electric charges, which have occurred in the photo-conductive layer 104, are accumulated in each of the capacitors 210, 210, . . . and act as the electrostatic latent image corresponding to the optical read-out technique. With the TFT technique, the electrostatic latent image having been formed with the radiation is kept at the charge accumulating capacitors.

The specific constitutions of each of the capacitors 210, 210, . . . and each of the TFT's 220, 220, . . . of the AMA board 200 are illustrated in FIG. 6. Specifically, an AMA board substrate 230 is constituted of an electrical insulator. A grounding side electrode 210a of the capacitor 210 and a gate electrode 220a of the TFT 220 are formed on the surface of the AMA board substrate 230. Above the grounding side electrode 210a of the capacitor 210 and the gate electrode 220a of the TFT 220, a connection side electrode 210b of the capacitor 210 is formed via an insulating film 240. Also, above the grounding side electrode 210a of the capacitor 210 and the gate electrode 220a of the TFT 220, a source electrode 220b and a drain electrode 220c of the TFT 220 are formed via the insulating film 240. Further, the top surface of the AMA board 200 is covered with a protective insulating film 250. The connection side electrode 210b of the capacitor 210 and the source electrode 220b of the TFT 220 are connected with each other and are formed together with each other. The insulating film 240 constitutes both the capacitor insulating film of the capacitor 210 and the gate insulating film of the TFT 220. The insulating film 240 may be constituted of, for example, a plasma SiN film. The AMA board 200 may be produced by use of a thin film forming technique or a fine processing technique, which is ordinarily employed for the production of a liquid crystal display board.

The joining of the radiation detecting section 100 and the AMA board 200 will be described hereinbelow. Specifically, the position of the detection electrode 107 and the position of the connection side electrode 210b of the capacitor 210 are matched with each other. In this state, the radiation detecting section 100 and the AMA board 200 are laminated together by adhesion under heating and under pressure with an anisotropic electrically conductive film (ACF) intervening therebetween. The ACF contains electrically conductive particles, such as silver particles, and has the electrical conductivity only in the thickness direction. In this manner, the radiation detecting section 100 and the AMA board 200 are mechanically combined with each other. At the same time, the detection electrode 107 and the connection side electrode 210b are electrically connected with each other by an intervening conductor section 140.

Also, the AMA board 200 is provided with a read-out actuating circuit 260 and a gate actuating circuit 270. As illustrated in FIG. 7, the read-out actuating circuit 260 is connected to each of read-out wiring lines (read-out address lines) 280, 280, . . . Each of the read-out wiring lines 280, 280, . . . extends in the vertical (Y) direction and connects the drain electrodes 220c, 220c, . . . of the TFT's 220, 220, . . . , which are arrayed along an identical column. The gate actuating circuit 270 is connected to each of read-out wiring lines (gate address lines) 290, 290, . . . Each of the read-out wiring lines 290, 290, . . . extends in the horizontal (X) direction and connects the gate electrodes 220a, 220a, . . . of the TFT's 220, 220, . . . , which are arrayed along an identical row. Though not shown, in the read-out actuating circuit 260, one pre-amplifier (one electric charge-to-voltage converter) is connected to each of the read-out wiring lines 280, 280, . . . In this manner, the AMA board 200 is connected to the read-out actuating circuit 260 and the gate actuating circuit 270. Alternatively, the read-out actuating circuit 260 and the gate actuating circuit 270 may be formed into an integral body within the AMA board 200.

The radiation detecting operations performed by the radiation image recording and read-out system, which comprises the radiation detecting section 100 and the AMA board 200 joined together, are described in, for example, Japanese Unexamined Patent Publication No. 11(1999)-287862.

The present invention will further be illustrated by the following non-limitative examples.

EXAMPLES

Example 1

Bismuth oxide ($Bi_2O_3$) particles and germanium oxide ($GeO_2$) particles were mixed together in a molar ratio of 2:3. The resulting mixture was then subjected to a ball mill mixing process in ethanol by use of zirconium oxide balls. The mixture having been subjected to the ball mill mixing process was recovered and dried. Thereafter, the mixture was subjected to a preliminary firing process in a muffle furnace at a temperature of 800° C. for eight hours. In this manner, $Bi_4Ge_3O_{12}$ particles were obtained from the solid phase reaction of bismuth oxide and germanium oxide. The thus obtained $Bi_4Ge_3O_{12}$ particles were then subjected to a mortar grinding process, and the thus ground $Bi_4Ge_3O_{12}$ particles were passed through a sieve having a mesh of at most 150 μm. The $Bi_4Ge_3O_{12}$ particles having thus been obtained were then subjected to a grinding and dispersing process in ethanol with a ball mill by use of zirconium oxide balls. The thus obtained particles had a mean particle diameter of approximately 4 μm. Also, an inspection of the crystal phase with an X-ray analysis apparatus (RINT-ULTIMA+, supplied by Rigaku Denki K.K.) revealed that the thus obtained particles had a $Bi_4Ge_3O_{12}$ single phase. Thereafter, the thus obtained $Bi_4Ge_3O_{12}$ particles and a polyester binder (Vylon 300, supplied by Toyobo Co., Ltd.) in a weight ratio of 9:1 were then subjected to a mixing and dispersing process using a methyl ethyl ketone solvent. The thus obtained dispersion was applied onto an Al substrate by use of a doctor blade technique, and the thus obtained coating layer was dried. In this manner, a coating film (a photo-conductive layer) having a thickness of approximately 200 μm was obtained.

Example 2

$Bi(NO_3)_3.5H_2O$ particles were dissolved in a 10% nitric acid solution, and a 0.2M aqueous solution was thereby prepared. (The thus prepared aqueous solution will hereinbelow be referred to as the B-1 solution.) Also, $Na_2SiO_3.9H_2O$ particles were dissolved in water, and a 0.2M aqueous solution was thereby prepared. (The thus prepared aqueous solution will hereinbelow be referred to as the S-1 solution.) The B-1 solution and the S-1 solution were mixed together in a ratio of 4:3, and a 28% aqueous ammonia solution was then added with stirring to the resulting mixed solution. In this manner, a white precipitate was obtained. A washing operation, in which the white precipitate was washed with water, and a supernatant liquid was discarded with centrifuging, was iterated five times. The thus washed white precipitate was recovered and dried. Thereafter, the white precipitate was subjected to a firing process in a muffle furnace at a temperature of 800° C. for two hours. In this manner, $Bi_4Si_3O_{12}$ particles having a mean particle diameter of approximately 1 μm were obtained. An inspection of the crystal phase of the thus obtained $Bi_4Si_3O_{12}$ particles with the X-ray analysis apparatus revealed that the thus obtained particles had a $Bi_4Si_3O_{12}$ single phase. Thereafter, the thus obtained $Bi_4Si_3O_{12}$ particles and a polyester binder (Vylon 300, supplied by Toyobo Co., Ltd.) in a weight ratio of 9:1 were then subjected to a mixing and dispersing process using a methyl ethyl ketone solvent. The thus obtained dispersion was applied onto an Al substrate by use of a doctor blade technique, and the thus obtained coating layer was dried. In this manner, a coating film (a photo-conductive layer) having a thickness of approximately 200 μm was obtained.

Example 3

A titanium peroxocitric acid ammonium tetrahydrate (TAS-Fine, supplied by Furuuchi Kagaku K.K.) was dissolved in water, and a 0.2M aqueous solution was thereby prepared. (The thus prepared aqueous solution will hereinbelow be referred to as the T-1 solution.) Also, the B-1 solution prepared in Example 2 and the T-1 solution were mixed together in a ratio of 4:3, and a 28% aqueous ammonia solution was then added with stirring to the resulting mixed solution. In this manner, a white precipitate was obtained. A washing operation, in which the white precipitate was washed with water, and a supernatant liquid was discarded with centrifuging, was iterated five times. The thus washed white precipitate was recovered and dried. Thereafter, the white precipitate was subjected to a firing process in a muffle furnace at a temperature of 800° C. for two hours. In this manner, $Bi_4Ti_3O_{12}$ particles having a mean particle diameter of approximately 1 μm were obtained. An inspection of the crystal phase of the thus obtained $Bi_4Ti_3O_{12}$ particles with the X-ray analysis apparatus revealed that the thus obtained particles had a $Bi_4Ti_3O_{12}$ single phase. Thereafter, the thus obtained $Bi_4Ti_3O_{12}$ particles and a polyester binder (Vylon 300, supplied by Toyobo Co., Ltd.) in a weight ratio of 9:1 were then subjected to a mixing and dispersing process using a methyl ethyl ketone solvent. The thus obtained dispersion was applied onto an Al substrate by use of a doctor blade technique, and the thus obtained coating layer was dried. In this manner, a coating film (a photo-conductive layer) having a thickness of approximately 200 µm was obtained.

Example 4

Bismuth oxide ($Bi_2O_3$) particles and silicon oxide ($SiO_2$) particles were mixed together in a molar ratio of 2:3. The resulting mixture was then subjected to a ball mill mixing process in ethanol by use of zirconium oxide balls. The mixture having been subjected to the ball mill mixing process was recovered and dried. Thereafter, the mixture was subjected to a preliminary firing process in a muffle furnace at a temperature of 800° C. for six hours. In this manner, $Bi_4Si_3O_{12}$ particles were obtained from the solid phase reaction of bismuth oxide and silicon oxide. The thus obtained $Bi_4Si_3O_{12}$ particles were then subjected to a mortar grinding process, and the thus ground $Bi_4Si_3O_{12}$ particles were passed through a sieve having a mesh of at most 150 µm. The $Bi_4Si_3O_{12}$ particles having thus been obtained were then subjected to a grinding and dispersing process in ethanol with a ball mill by use of zirconium oxide balls. At the time of the grinding and dispersing process, 0.4 wt % of a polyvinyl butyral (PVB) was added as a dispersing agent for promoting the dispersing. Thereafter, 0.7 wt % of PVB acting as a binder and 0.8 wt % of dioctyl phthalate acting as a plasticizer were added, and the resulting mixture was further subjected to a grinding and dispersing process with a ball mill. In this manner, a slurry for sheet formation was prepared. The recovered slurry was defoamed and concentrated with a vacuum defoaming process, and the viscosity of the slurry was adjusted at 50 poise.

The slurry having the adjusted viscosity was coated with a coater onto a film base, to which a releasing agent had been applied. The slurry was coated at a rate such that the film thickness after firing might become equal to approximately 200 µm. The thus obtained coating layer was then formed into a sheet shape. The thus obtained sheet was left to stand at the room temperature for 24 hours and dried. The dried sheet was then separated from the film base. The sheet having been separated from the film base was located on an aluminum oxide sintered material at a setter and subjected to a sintering process at a sintering temperature of 800° C. The thus sintered Bi4Si3O12 film was joined with an Al substrate by use of an electrically conductive paste dotite (supplied by Fujikura Kasei K.K.), and a photo-conductive layer was thereby obtained.

Comparative Example 1

Firstly, 1 g of bismuth iodide ($BiI_3$) and 1 g of Nylon CM4000 (a 6-nylon/6,6-nylon composite material, supplied by Toray Industries, Inc.) were added to 100 ml of methanol, which had been subjected to dehydration with a molecular sieve, and were perfectly dissolved at a temperature of 60° C. with stirring. After the dissolution, methanol was evaporated at a temperature of 60° C. with stirring. In this manner, a high-viscosity bismuth iodide/Nylon CM4000 liquid was obtained. The high-viscosity bismuth iodide/Nylon CM4000 liquid was applied dropwise onto an Al substrate (substrate temperature: 0° C. to 50° C.), and a film was formed with a spatula at the room temperature. After the film formation, the substrate provided with the bismuth iodide/Nylon CM4000 film was left at rest in a methanol-containing laboratory dish and dried gradually. In this manner, a coating film (photo-conductive layer) having a thickness of 200 µm was obtained.

A gold layer having a thickness of 60 nm was formed as a top electrode with a sputtering process on each of the photo-conductive layers obtained in Examples 1 to 4 and Comparative Example 1. Thereafter, an X-ray photo-current signal was applied under the condition of a voltage of 80 kV, and 10mR X-rays were irradiated for 0.1 second. A pulsed photo-current occurring under the condition of voltage application (the voltage was applied so as to correspond to an electric field of 2.5V/µm) was converted into a voltage by use of a current amplifier, and the voltage was measured with a digital oscilloscope. In accordance with the obtained current-time curve, integration was made within the range of the X-ray irradiation time, and the quantity of the formed electric charges was measured. Also, a dark current was measured as a current value in the same manner as the measurement of the photo-current in a dark place without irradiation of the X-rays.

The results listed in Table 1 below were obtained. The quantity of the formed electric charges was represented as a relative value with the quantity of the formed electric charges, which quantity was measured for the photo-conductive layer obtained in Comparative Example 1 and with the measuring method described above, being taken as 100. Also, the dark current was represented as a relative value with the dark current, which was measured for the photo-conductive layer obtained in Comparative Example 1 and with the measuring method described above, being taken as 1.

TABLE 1

| | Photo-conductive material | Producing process | Quantity of formed electric charges (relative value) | Dark current |
| --- | --- | --- | --- | --- |
| Ex. 1 | $Bi_4Ge_3O_{12}$ | Coating | 120 | 0.6 |
| Ex. 2 | $Bi_4Si_3O_{12}$ | Coating | 135 | 0.5 |
| Ex. 3 | $Bi_4Ti_3O_{12}$ | Coating | 141 | 0.5 |
| Ex. 4 | $Bi_4Si_3O_{12}$ | Sintering | 3300 | 10 |
| Comp. Ex. 1 | $BiI_3$ | Coating | 100 | 1 |

As clear from Table 1, each of the photo-conductive layers containing $Bi_4M_3O_{12}$ in accordance with the present invention, which were obtained in Examples 1, 2, and 3 with the coating technique, had the effect of collecting the formed electric charges, which effect was 1.2 to 1.4 times as large as the effect of the photo-conductive layer containing $BiI_3$. Also, the photo-conductive layer containing $Bi_4M_3O_{12}$ in accordance with the present invention, which was obtained as the sintered film in Example 4, had the effect of collecting the formed electric charges, which effect was 33 times as large as the effect of the photo-conductive layer containing $BiI_3$. Further, each of the photo-conductive layers containing $Bi_4M_3O_{12}$ in accordance with the present invention, which were obtained in Examples 1, 2, and 3 with the coating technique, exhibited the dark current, which was one half of the dark current measured for the photo-conductive layer containing $BiI_3$. With each of the photo-conductive layers containing $Bi_4M_3O_{12}$ in accordance with the present invention, which were obtained in Examples 1, 2, and 3 with the coating technique, since the electric noise was low, an image having good graininess characteristics was capable of being obtained. The photo-conductive layer containing $Bi_4M_3O_{12}$ in accordance with the present invention, which was obtained as the sintered film in Example 4, exhibited a large dark current. However, with the photo-conductive layer containing $Bi_4M_3O_{12}$ in accordance with the present invention, which was obtained as the sintered film in Example 4, the dark current was not large with respect to the high sensitivity, and therefore a marked improvement in signal-to-noise ratio and marked enhancement of the sensitivity were achieved.

As described above, with the photo-conductive layer in accordance with the present invention, which contains $Bi_4M_3O_{12}$, a large effect of collecting the formed electric charges is capable of being obtained, and the sensitivity is capable of being enhanced. Also, with the photo-conductive layer in accordance with the present invention, since electric noise is capable of being kept low, an image with good graininess characteristics is capable of being obtained. Further, the photo-conductive layer in accordance with the present invention has the advantages in that the photo-conductive layer has good durability and is free from any toxicity, and in that the load to the environment is capable of being kept small.

What is claimed is:

1. A radiation imaging panel, comprising a photo-conductive layer which is capable of recording radiation image information as an electrostatic latent image,
    wherein the photo-conductive layer contains $Bi_4M_3O_{12}$, in which M represents at least one kind of element selected from the group consisting of Ge, Si, and Ti, and
    wherein said radiation imaging panel is a direct conversion type radiation imaging panel that directly converts radiation to electrical charges and accumulates the electrical charges.

2. A radiation imaging panel, comprising a photo-conductive layer which is capable of recording radiation image information as an electrostatic latent image,
    wherein the photo-conductive layer contains $Bi_4M_3O_{12}$, in which M represents at least one kind of element selected from the group consisting of Ge, Si, and Ti,
    wherein the photo-conductive layer is formed with a coating technique, and
    wherein said radiation imaging panel is a direct conversion type radiation imaging panel that directly converts radiation to electrical charges and accumulates the electrical charges.

3. A radiation imaging panel, comprising a photo-conductive layer which is capable of recording radiation image information as an electrostatic latent image,
    wherein the photo-conductive layer contains $Bi_4M_3O_{12}$, in which M represents at least one kind of element selected from the group consisting of Ge, Si, and Ti,
    wherein the photo-conductive layer is a sintered film, and
    wherein said radiation imaging panel is a direct conversion type radiation imaging panel that directly converts radiation to electrical charges and accumulates the electrical charges.

* * * * *